US006384758B1

(12) United States Patent
Michalski et al.

(10) Patent No.: US 6,384,758 B1
(45) Date of Patent: May 7, 2002

(54) HIGH-SPEED SAMPLER STRUCTURES AND METHODS

(75) Inventors: Christopher Michalski, High Point; David Graham Nairn, Greensboro, both of NC (US)

(73) Assignee: Analog Devices, Inc., Norwood, MA (US)

( * ) Notice: Subject to any disclaimer, the term of this patent is extended or adjusted under 35 U.S.C. 154(b) by 30 days.

(21) Appl. No.: 09/723,956

(22) Filed: Nov. 27, 2000

(51) Int. Cl.[7] .................................................. H03M 1/00

(52) U.S. Cl. .......................... 341/122; 327/94; 307/353

(58) Field of Search ................................ 341/122, 156, 341/155, 161, 162; 327/91, 94, 95, 96; 307/353

(56) References Cited

U.S. PATENT DOCUMENTS 4,570,080 A * 2/1986 Swanson .................... 307/353
5,081,372 A * 1/1992 Pelgrom ..................... 307/353
5,982,205 A * 11/1999 Vallancourt .................. 327/94

* cited by examiner

*Primary Examiner*—Brian Young
*Assistant Examiner*—John Nguyen
(74) *Attorney, Agent, or Firm*—Koppel, Jacobs, Patrick & Heybl

(57) ABSTRACT

High-speed sampler methods and structures are provided to enhance the correlation between an input signal $S_{in}$ and a corresponding sampler output voltage $V_{out}$. An input buffer is enabled during sampling time periods and disabled during holding time periods. In the sampling time periods, a sampling capacitor $C_s$ is directly charged through the input buffer and the capacitor's bottom plate to a charge that corresponds to the input signal $S_{in}$. In the holding time periods, the disabled input buffer is isolated from the sampling capacitor $C_s$ and a common-mode signal $S_{cm}$ is directly coupled to the capacitor's bottom plate to provide the output voltage $V_{out}$ at the capacitor's top plate. Preferably, an output capacitor $C_o$ is coupled to the sampling capacitor $C_s$ and charge from the sampling capacitor $C_s$ is transferred to the output capacitor $C_o$.

20 Claims, 7 Drawing Sheets

HIGH-SPEED SAMPLER STRUCTURES AND METHODS

BACKGROUND OF THE INVENTION

1. Field of the Invention

The present invention relates generally to samplers that sample an input signal $S_{in}$ and hold a corresponding output voltage $V_{out}$ through successive and alternate sampling and holding time periods.

2. Description of the Related Art

Signal samplers are typically used to successively sample and hold the amplitudes of analog signals and provide the resulting samples for further processing (e.g., in an analog-to-digital conversion). Sampler structures have been described under various names (e.g., sample and holds, sample-and-hold amplifiers (SHAs) and track and hold circuits) and various structural configurations have been proposed (e.g., see U.S. Pat. Nos. 4,962,325 issued Oct. 9, 1990 to Miller, et al., 5,315,170 issued May 25, 1994 to Vinn, et al., 5,389,929 issued Feb. 14, 1995 to Nayebi, et al., 5,418,408 issued May 23, 1995 to Mangelsdorf, et al., 5,457,418 issued Oct. 10, 1995 to Chang, 5,838,175 issued Nov. 17, 1998 to Hsieh and 6,028,459 issued Feb. 22, 2000 to Birdsall, et al.).

Although various conventional sampler configurations can sample and hold an input signal $S_{in}$, their structures often corrupt this process so that the correlation between the input signal $S_{in}$ and a corresponding output voltage $V_{out}$ is degraded. FIG. 3 of U.S. Pat. No. 4,962,325, for example, shows a switched-capacitor prior art sampler in which serially-arranged input switches gate an input signal to sampling capacitors that are coupled to the input of a differential output amplifier. Other switches facilitate transfer of charges from the sampling capacitors to output capacitors that are arranged across the differential output amplifier.

When the serially-arranged input switches are realized with high speed transistors, the input signal $S_{in}$ is typically passed through the transistors' current terminals and this passage is gated with control signals on the transistors' control terminals. In this arrangement, however, the input switches corrupt the input signal $S_{in}$ with consequent degradation (e.g., harmonic distortion) of the sampler's output voltage $V_{out}$.

SUMMARY OF THE INVENTION

The present invention is directed to sampler methods and structures that enhance the correlation between an input signal $S_{in}$ and a corresponding sampler output voltage $V_{out}$. These goals are realized by providing a supply current to an input buffer to enable it during sampling time periods and removing the supply current to disable and isolate the input buffer during holding time periods.

In the sampling time periods, the bottom plate of a sampling capacitor $C_s$ is directly charged through the input buffer to a charge that corresponds to the input signal $S_{in}$.

In the holding time periods, the input buffer is isolated from the sampling capacitor $C_s$ and a common-mode signal $S_{cm}$ is directly coupled the capacitor's bottom plate to transfer electrical charge from the sampling capacitor $C_s$ to the output capacitor $C_o$ and thereby generate the output voltage $V_{out}$ across the output capacitor $C_o$.

These processes facilitate the replacement of serially-arranged switches and their attendant harmonic distortion with an alternately enabled and disabled input buffer that alternately charges a sampling capacitor $C_s$ and is isolated from the sampling capacitor $C_s$. Sampler embodiments are described for practicing the processes of the invention.

The novel features of the invention are set forth with particularity in the appended claims. The invention will be best understood from the following description when read in conjunction with the accompanying drawings.

DETAILED DESCRIPTION OF THE PREFERRED EMBODIMENTS

Figure 1:
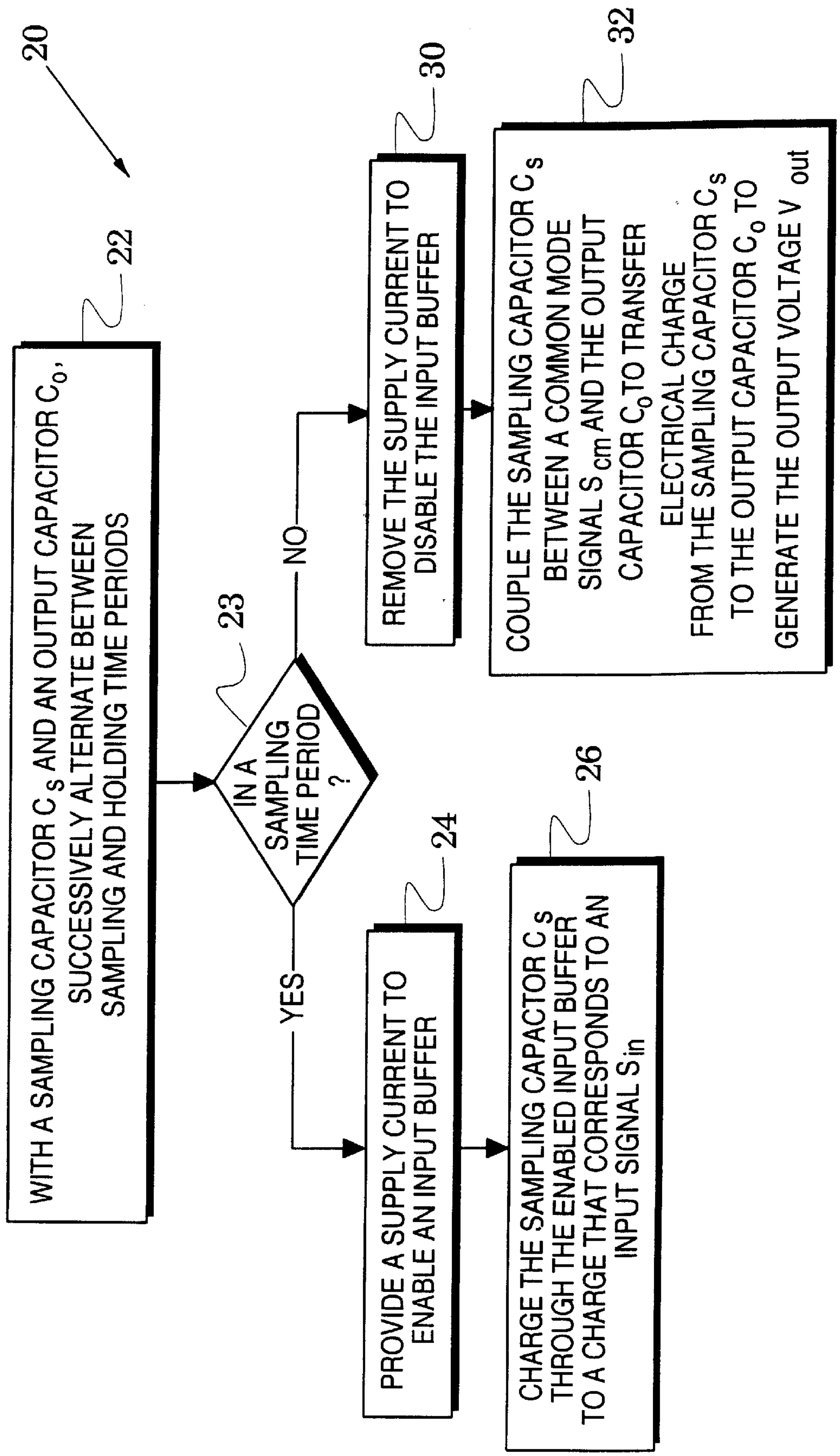
FIG. 1 is a flow chart that illustrates a sampling method embodiment of the present invention.

FIG. 1 is a flow chart 20 that is directed to the sampling and holding of an input signal $S_{in}$ that includes a common-mode signal $S_{cm}$ component (i.e., the input signal $S_{in}$ is superimposed on the common-mode signal $S_{cm}$). In particular, the flow chart recites a method of sampling the input signal $S_{in}$ and holding a corresponding output voltage $V_{out}$ through successive and alternate sampling and holding time periods. A first process step 22 of FIG. 1 provides a sampling capacitor $C_s$ and an output capacitor $C_o$ and successively alternates between sampling and holding time periods.

Decision 23 asks if the method is in a sampling time period and moves, if the answer is affirmative, to process steps 24 and 26. Process step 24 provides a supply current to enable an input buffer. In process step 26, the input signal $S_{in}$ charges the sampling capacitor $C_s$ through the enabled input buffer to a charge that corresponds to the input signal $S_{in}$.

If the answer to decision 23 is negative, the method proceeds to process steps 30 and 32. Step 30 disables the input buffer by removing the supply current from it. In the holding time periods, step 32 couples the sampling capacitor $C_s$ between the common-mode signal $S_{cm}$ and the output capacitor $C_o$ to directly transfer electrical charge from the sampling capacitor $C_o$. to the output capacitor $C_o$ and thereby generate the output voltage $V_{out}$ across the output capacitor $C_o$.

Figure 2:
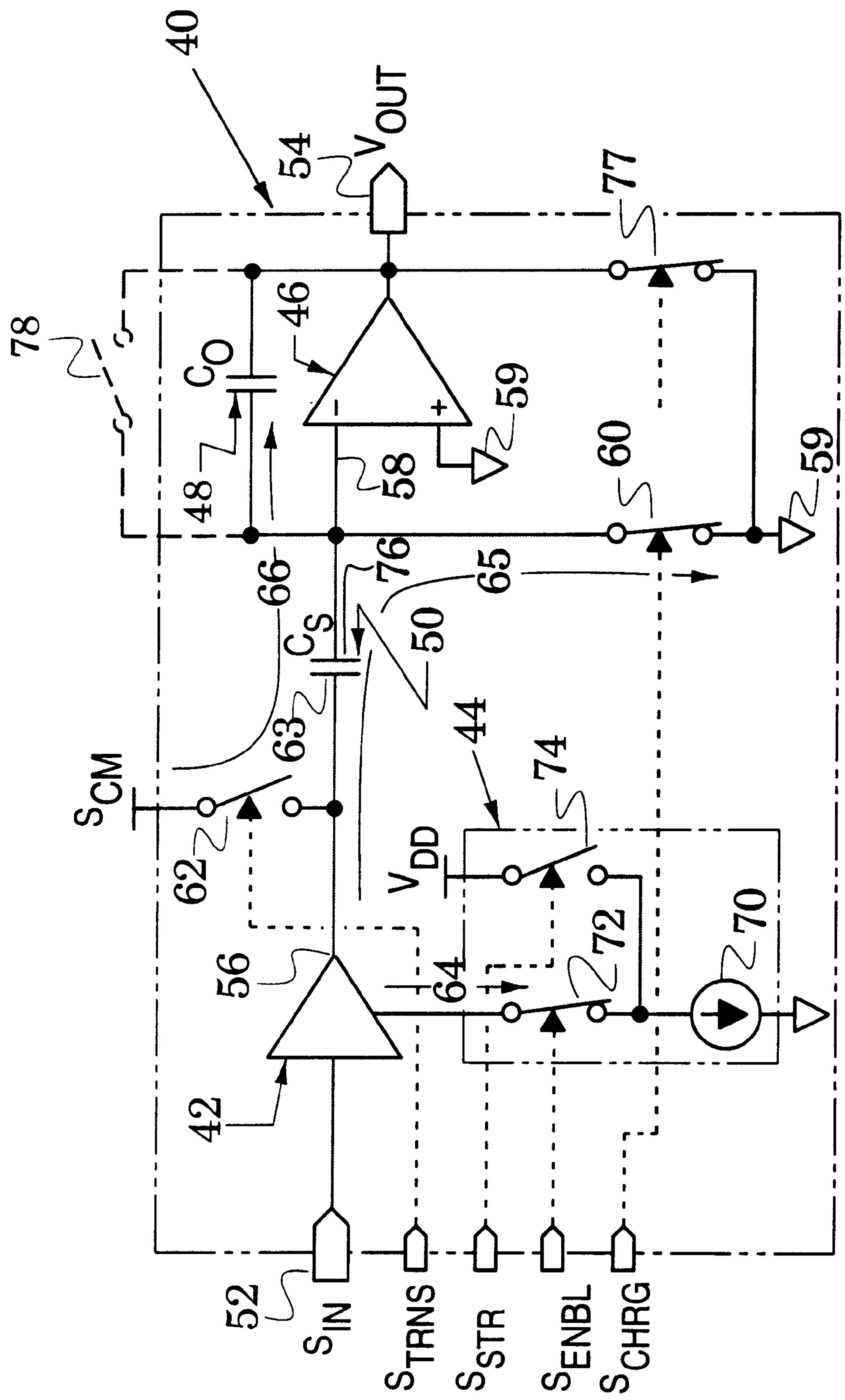
FIG. 2 is a schematic of a sampler embodiment for practicing the method of FIG. 1.

The processes of FIG. 1 can be best understood in the context of sampler structures with which the processes may be practiced. For example, FIG. 2 is a schematic of a sampler 40 that includes an input buffer 42, a current-source circuit 44, a differential amplifier 46, an output capacitor 48 and a sampling capacitor 50.

The input buffer 42 responds to an input signal $S_{in}$ at an input port 52 and the differential amplifier 46 provides a corresponding output voltage $V_{out}$ at an output port 54. The sampling capacitor $C_s$ (50) is directly connected to the output port 56 of the input buffer 42 and to the inverting input port 58 of the differential amplifier 46. The output capacitor $C_o$ is coupled between the inverting input port 58 and the output port 54. In addition, a charging switch 60 is positioned between the inverting input port 58 and the noninverting input port of the differential amplifier 46 (via signal grounds 59) and a charge-transfer switch 62 couples a bottom plate 63 of the sampling capacitor $C_s$ to the common-mode signal $S_{cm}$.

During the sampling time periods of process step 22 of FIG. 1, the sampler 40 is placed in a sampling operational mode wherein a charging signal $S_{chrg}$ is applied to close the charging switch 60 and the charge-transfer switch (62) remains open. The current-source circuit 44 is arranged to provide a supply current 64 to the input buffer 42 so that it is enabled during the sampling time periods.

Accordingly, the enabled input buffer 42 responds to the input signal $S_{in}$ by generating a charging current 65 that charges the sampling capacitor $C_s$ (50) to a sampled electrical charge $Q_s=C_s S_{in}$ that corresponds to the present value of the input signal $S_{in}$. Thus, the sampler 40 realizes the process steps 24 and 26 of FIG. 1 during the sampling time periods. Closing the charging switch 60 during the sampling time periods essentially connects the input signal $S_{in}$, the input buffer 42, the sampling capacitor $C_s$ and the charging switch 60 in a charging path that is defined by the charging current 65 in FIG. 1.

During the holding time periods of process step 22 of FIG. 1, the sampler 40 is placed in a holding operational mode wherein a transfer signal $S_{trns}$ is applied to close the charge-transfer switch 62 (opposite to the position shown) and the charging signal $S_{chrg}$ is removed to thereby open the charging switch 60 (opposite to the position shown). The current-source circuit 44 is arranged to remove the supply current 63 from the input buffer 42 so that it is disabled. The input buffer is thus isolated from the succeeding elements of the sampler (in particular, from the sampling capacitor $C_s$) during the holding time periods.

Accordingly, the low-impedance common-mode signal $S_{cm}$ directly drives the bottom plate 63 of the sampling capacitor $C_s$ and a charge-transfer current 66 flows from the sampling capacitor $C_s$ to the output capacitor $C_o$. The sampled electrical charge $Q_s$ is thus directly transferred from the sampling capacitor 50 to become an output electrical charge $Q_o$ in the output capacitor 48 wherein $Q_o=Q_s$ because of charge conservation.

The output electrical charge generates the output voltage $V_{out}$ across the sampling capacitor $C_s$ (50) so that $$Q_o=C_oV_{out}=C_sS_{in} \tag{1}$$

and therefore $$V_{out}=(C_s/C_o)S_{in} \tag{2}$$

That is, charge is transferred to generate an output voltage $V_{out}$ across the output capacitor $C_o$ with a gain of $C_s/C_o$ relative to the input signal $S_{in}$.

The current-source circuit 44 of FIG. 2 includes a current source 70 that generates the supply current 64 and also includes an enable switch 72 that couples the current source to the input buffer 42. During the sampling time periods of the process step 22 of FIG. 1, an enable signal $S_{enbl}$ closes the enable switch 72 so that the supply current 64 is provided to enable the input buffer 42.

During the holding time periods of the process step 22 of FIG. 1, the enable signal $S_{enbl}$ is removed to thereby open the enable switch 72 (opposite to the position shown) so that the supply current 64 is removed from the input buffer 42 and it is thereby disabled and isolated. Preferably, the current-source circuit 44 also includes a steering switch 74 that is closed (opposite to the position shown) by a steering signal $S_{str}$ so that the supply current 64 is steered to a supply voltage $V_{DD}$ during the holding time periods.

The sampler 40 of FIG. 2 has a "bottom plate" architecture wherein the input buffer 42 is enabled and supplies charge directly to the bottom plate 63 of the sampling capacitor 50 in the sampling time periods and the common-mode signal $S_{cm}$ is directly connected to the bottom plate 63 during the holding time periods. In the latter periods, the buffer is isolated from the bottom plate 63 because it has been disabled.

The sampler 40 differs from a first group of conventional samplers that charge a sampling capacitor through its top plate (e.g., the top plate 76 of the sampling capacitor 50 in FIG. 2) and transfer charge also from this top plate. The sampler 40 also differs from a second group of conventional samplers that have a "bottom plate" architecture but insert a charging switch between the input signal $S_{in}$ and the bottom plate.

This serially-arranged charging switch is typically closed during sampling time periods and opened during holding time periods. In an exemplary charging switch arrangement, the source S of a metal-oxide semiconductor (MOS) transistor is connected to the input signal $S_{in}$, the transistor's drain D is connected to the sampling capacitor's bottom plate and the transistor's gate G is connected to a switching signal.

This structure, unfortunately, causes the transistor's gate-to-source voltage $V_{GS}$ to vary with the input signal $S_{in}$. Because the transistor's parasitic capacitances (e.g., $C_{GS}$, $C_{GD}$ and bulk capacitances $C_{BD}$ and $C_{BS}$) vary non-linearly with voltage, significant harmonic distortion is thus generated in the output voltage $V_{out}$ at relatively low input frequencies.

A third group of conventional samplers seek to reduce the transistor's distortion by adding supplemental structures that add a version of the input signal $S_{in}$ to the switching signal at the transistor's gate. This additional structure tends to reduce the varying signal across the $C_{GS}$ and $C_{GD}$ parasitic capacitances but has no comparable "bootstrapping" effect for the bulk parasitic capacitances.

This third group of conventional samplers thus realizes some distortion reduction but suffers the complexity and degraded reliability that result from the additional sampler structures. Moreover, the performance of this sampler arrangement at high sampling rates (e.g., >100 megasamples/second) and high analog input frequencies has typically been unsatisfactory.

In contrast, the sampler 40 of FIG. 2 eliminates serially-arranged switching structures and, instead, directly drives the bottom plate 63 of the sampling capacitor 50 with the enabled input buffer 42 during sampling time periods and directly drives the bottom plate with the common-mode signal $S_{cm}$ during holding time periods when the input buffer is disabled and isolated. The sampler 40 thereby avoids the distortion of serially-arranged switching structures and the complexity of additional input signal structures.

The output electrical charge $Q_o$ must be removed from the output capacitor 48 during each sampling time period so that it does not add to the sampled electrical charge $Q_s$ that will be transferred to it in the succeeding holding time period. This removal insures that the output voltage $V_{out}$ of equations (1) and (2) corresponds to the input signal $S_{in}$ of the preceding sampling time period.

This discharge of the output capacitor $C_o$ can be realized, for example, by coupling the output of the differential amplifier 46 to the ground 59 through a discharge switch $S_d$ (77) as shown in FIG. 2. In operation, the discharge switch 77 is opened (e.g., by the charging signal $S_{chrg}$) during the holding time periods. An equivalent discharge structure is assumed but not shown in other sampler embodiments of the invention. Alternatively, the discharge switch $S_d$ can be omitted and the structure of FIG. 2 used as an integrator (e.g., in a Delta-Sigma A/D converter).

Process step 32 of FIG. 1 coupled the sampling capacitor $C_s$ between the common-mode signal $S_{cm}$ and the output capacitor $C_o$ to directly transfer electrical charge from the sampling capacitor $C_s$ to the output capacitor $C_o$ and thereby generate an output voltage $V_{out}$ across the output capacitor $C_o$. In other sampler embodiments, the sampling capacitor $C_s$ may simply be coupled to the sampler output port 54 to provide a sampled output voltage $V_{out}$.

Preferably, a buffer is inserted to provide buffering between the sampling capacitor $C_s$ and circuits that are attached to the output port 54. This buffer may be realized, for example, by replacing the output capacitor $C_o$ in FIG. 2 with a switch 78 (shown in broken lines) which closes during the holding periods to convert the differential amplifier 46 into a voltage follower.

Figure 3A:
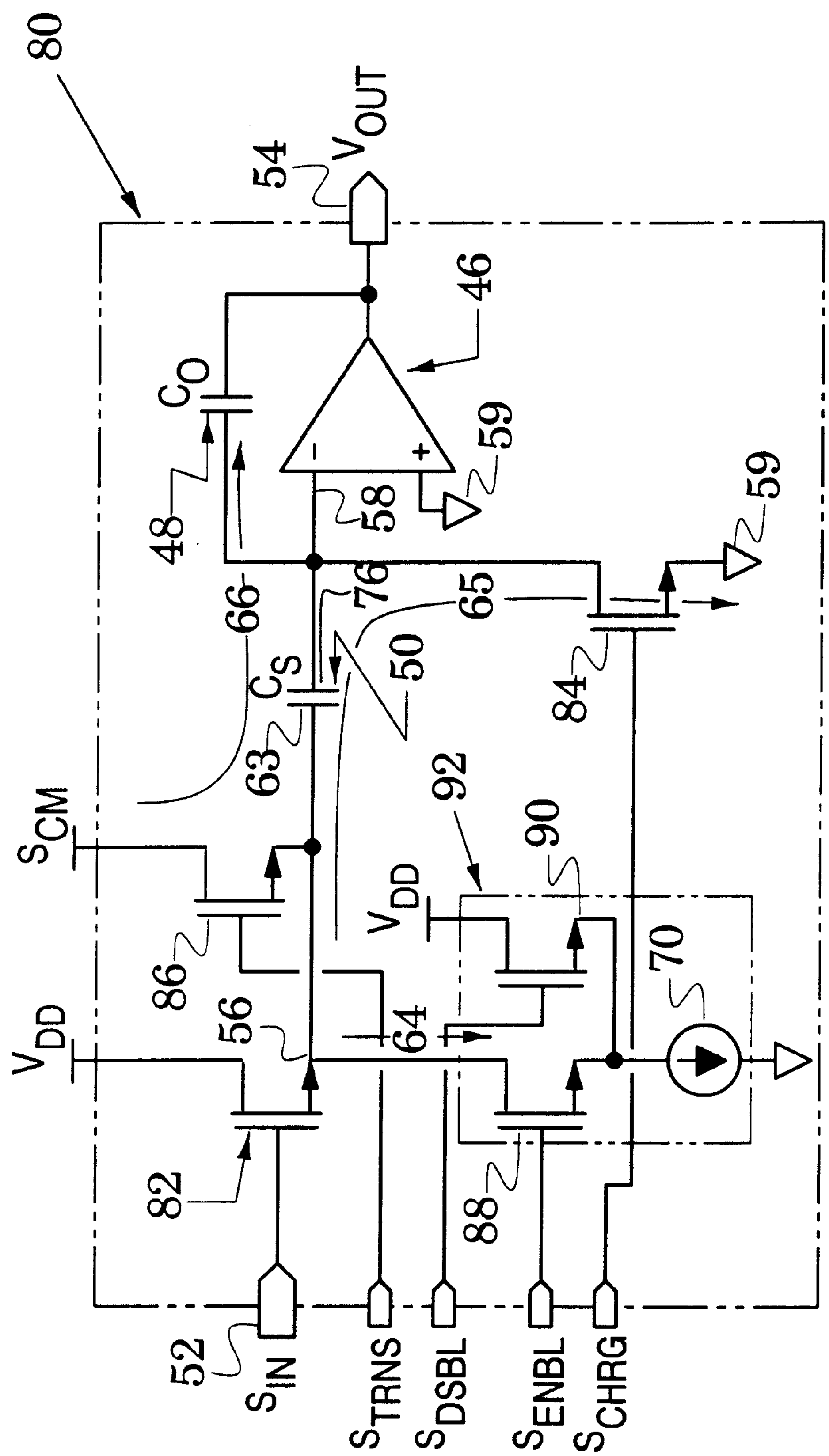
FIG. 3A is a schematic of a complementary metal-oxide semiconductor (CMOS) embodiment of the sampler of FIG. 2.

FIG. 3A illustrates a CMOS embodiment 80 of the sampler 40 of FIG. 2 in which like elements are indicated by like reference numbers. The sampler 80, however, realizes the input buffer 42 with a common source CMOS buffer transistor 82 and also realizes the charging switch 60, the charge-transfer switch 62, the enable switch 72 and the steering switch 74 with CMOS transistors.

In particular, the sampler 80 includes charging transistor 84, a charge-transfer transistor 86, an enable transistor 88 and a steering transistor 90. The enable transistor 88 and the steering transistor 90 form a differential pair of transistors within a current-source circuit 92 that steer the supply current 64 to the buffer transistor 82 during sampling time periods and to the supply voltage $V_{DD}$ during holding time periods.

In the holding time periods, charge-transfer transistor 86 is on and brings the source of the input buffer transistor 82 near the value of the common-mode signal $S_{cm}$. Accordingly, the common-mode signal $S_{cm}$ is selected sufficiently large enough to ensure that the input buffer transistor 82 never turns on (i.e., is enabled) for any value of the input signal $S_{in}$ at its gate. The common-mode signal $S_{cm}$ may be generated in various conventional ways. For example, a first resistive divider can be used to apply a selected common-mode signal $S_{cm}$ to the input signal $S_{in}$ and a similar second resistive divider can provide an identical common-mode signal $S_{cm}$ to the charge-transfer transistor 86.

Figure 3B:
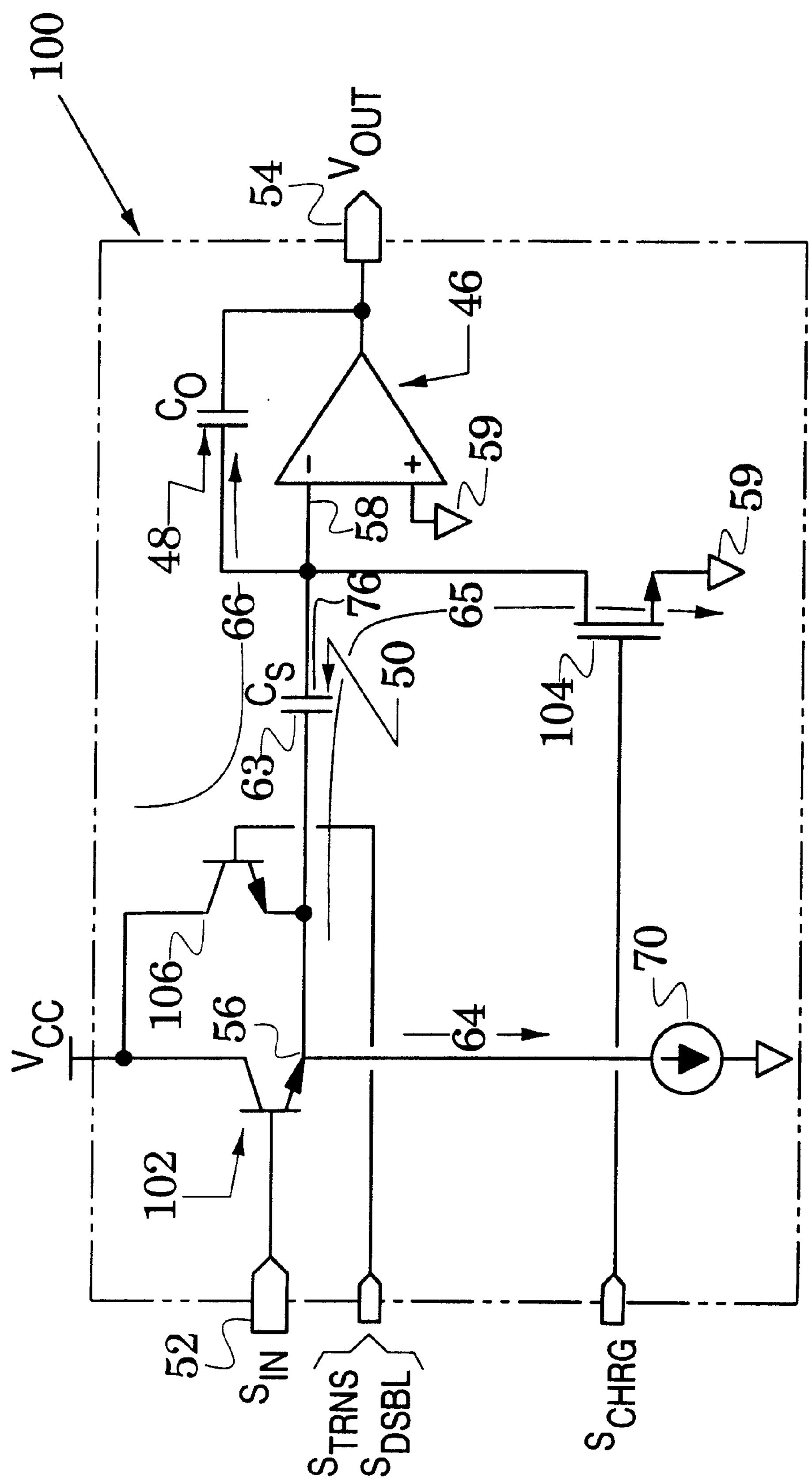
FIG. 3B is a schematic of a bipolar CMOS (BiCMOS) embodiment of the sampler of FIG. 2.

FIG. 3B illustrates a bipolar CMOS (BiCMOS) embodiment 100 of the sampler 40 of FIG. 2 in which like elements are indicated by like reference numbers. In contrast to the sampler 80 of FIG. 3A, the sampler 100 realizes the input buffer 42 of FIG. 2 with a common emitter bipolar buffer transistor 102, realizes the charging switch 60 with a CMOS charging transistor 104 and realizes the charge-transfer switch 62 with a bipolar charge-transfer transistor 106.

In the sampling time periods of the sampler 100, the charging signal $S_{chrg}$ is applied to bias on the charging transistor 104. During this time, the charge-transfer transistor 106 is off so that the input buffer transistor 102 is enabled by receipt of the supply current 64 from the current source 70.

In the holding time periods, the charge-transfer transistor 106 is turned on by the transfer signal $S_{trns}$ so that the supply current 64 is steered through the charge-transfer transistor. Because the supply current is steered away from the input buffer transistor 102, this transistor is disabled and isolated. The transfer signal $S_{trns}$ is applied to the base of the charge-transfer transistor 106 and its value is selected so that a signal substantially equal to the common-mode signal $S_{cm}$ appears at the emitter where it drives the bottom plate 63 of the sampling capacitor 50. Because the charge-transfer transistor 106 transfers charge from the sampling capacitor 50 to the output capacitor 48 and also disables the input buffer transistor 102, the signal on its base is titled both as a transfer signal $S_{trns}$ and as a disable signal $S_{dsbl}$ in FIG. 3B.

It is apparent that the input buffer transistor 102 and the charge-transfer transistor 106 form a differential pair of transistors that are each disabled when the supply current 64 is steered to the other of the differential pair. The common-mode signal $S_{cm}$ on the base of the charge-transfer transistor 106 is selected sufficiently large enough to ensure that the input buffer transistor 102 never turns on (i.e., be enabled) for any value of the input signal $S_{in}$ at its base.

Figure 4A:
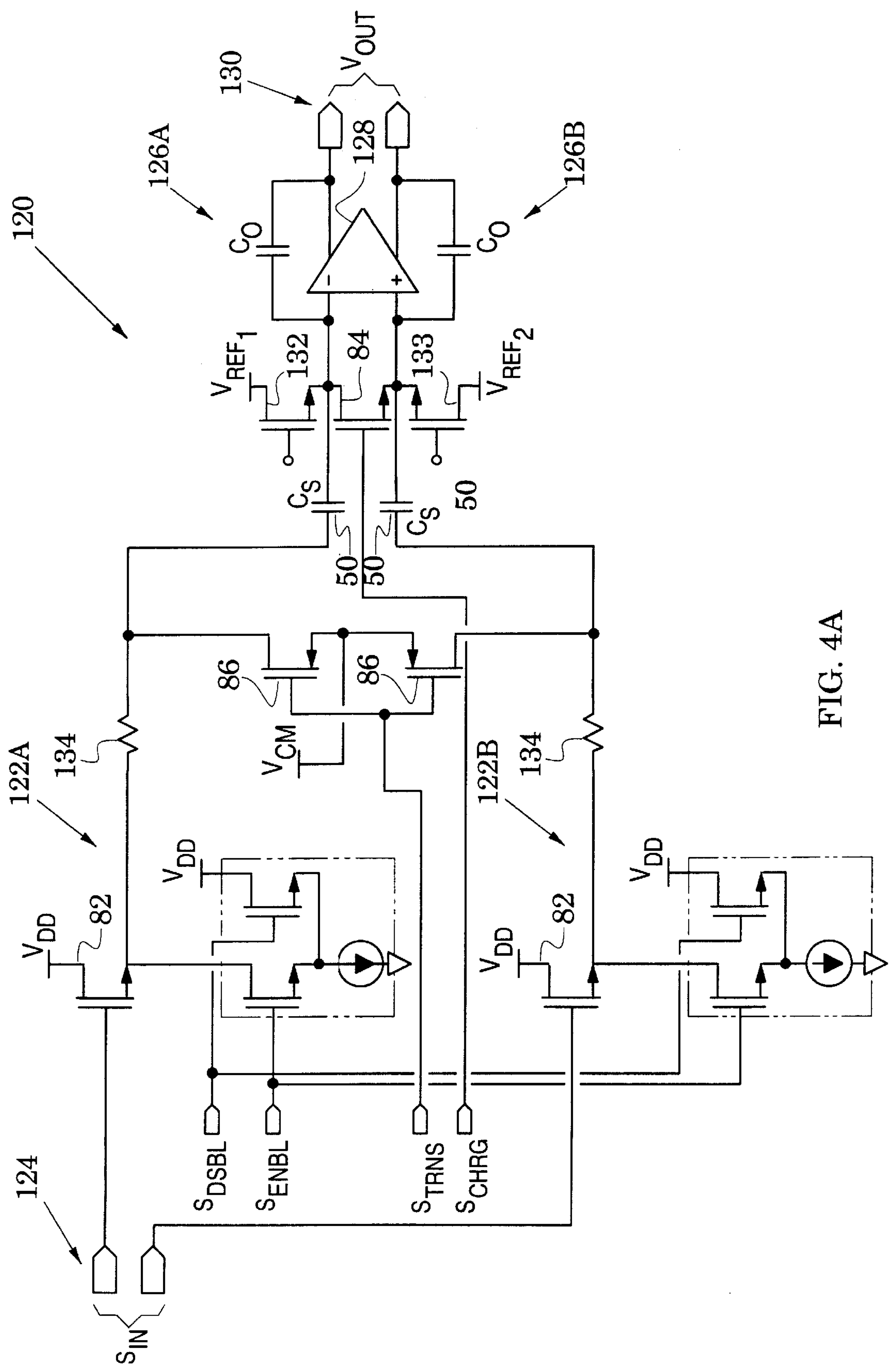
FIG. 4A is a schematic of a differential CMOS embodiment of the sampler of FIG. 2.

FIG. 4A illustrates a differential CMOS embodiment 120 of the sampler 80 of FIG. 3A. In the sampler 120, the current source 70, the common source input buffer transistor 82, the enable transistor 88 and the steering transistor 90 of FIG. 3A are represented by a first input buffer assembly 122A. A substantially-identical second input buffer assembly 122B is arranged with the first input buffer assembly to define a differential input port 124.

The charge-transfer transistor 86, sampling capacitor 50 and output capacitor 48 of FIG. 3A are represented by first and second output assemblies 126A and 126B that differentially drive a differential amplifier 128 which forms a differential output port 130. Each input buffer transistor 82 is coupled to a respective one of the sampling capacitors 50. The sources of the charge-transfer transistors 86 are coupled to the common-mode signal $S_{cm}$ and their gates are coupled to receive the transfer signal $S_{trns}$.

A single charging transistor 84 is coupled across the differential input of the differential amplifier 128 and responds to the charging signal SCHRG by substantially shorting together the top plates of the sampling capacitors 50 during the sampling time periods. Bias transistors 132 and 133 may be respectively coupled to the inverting and noninverting ports of the differential amplifier 128 to establish suitable reference voltages $V_{ref_1}$ and $V_{ref_2}$ during the sampling time periods when the charging transistor 84 is on.

Small resistors 134 (e.g., on the order of 100 ohms) may optionally be inserted between the input buffer assemblies 122A and 122B and the sampling capacitors $C_s$ to further limit parasitic coupling (i.e., suppress signal feedthrough) to the sampling capacitors 50. Operation of the sampler 120 is functionally equivalent to that of the sampler 80 of FIG. 3A except that a differential input signal $S_{in}$ is differentially processed to realize a differential output voltage $V_{out}$ at the differential output port 130.

Figure 4B:
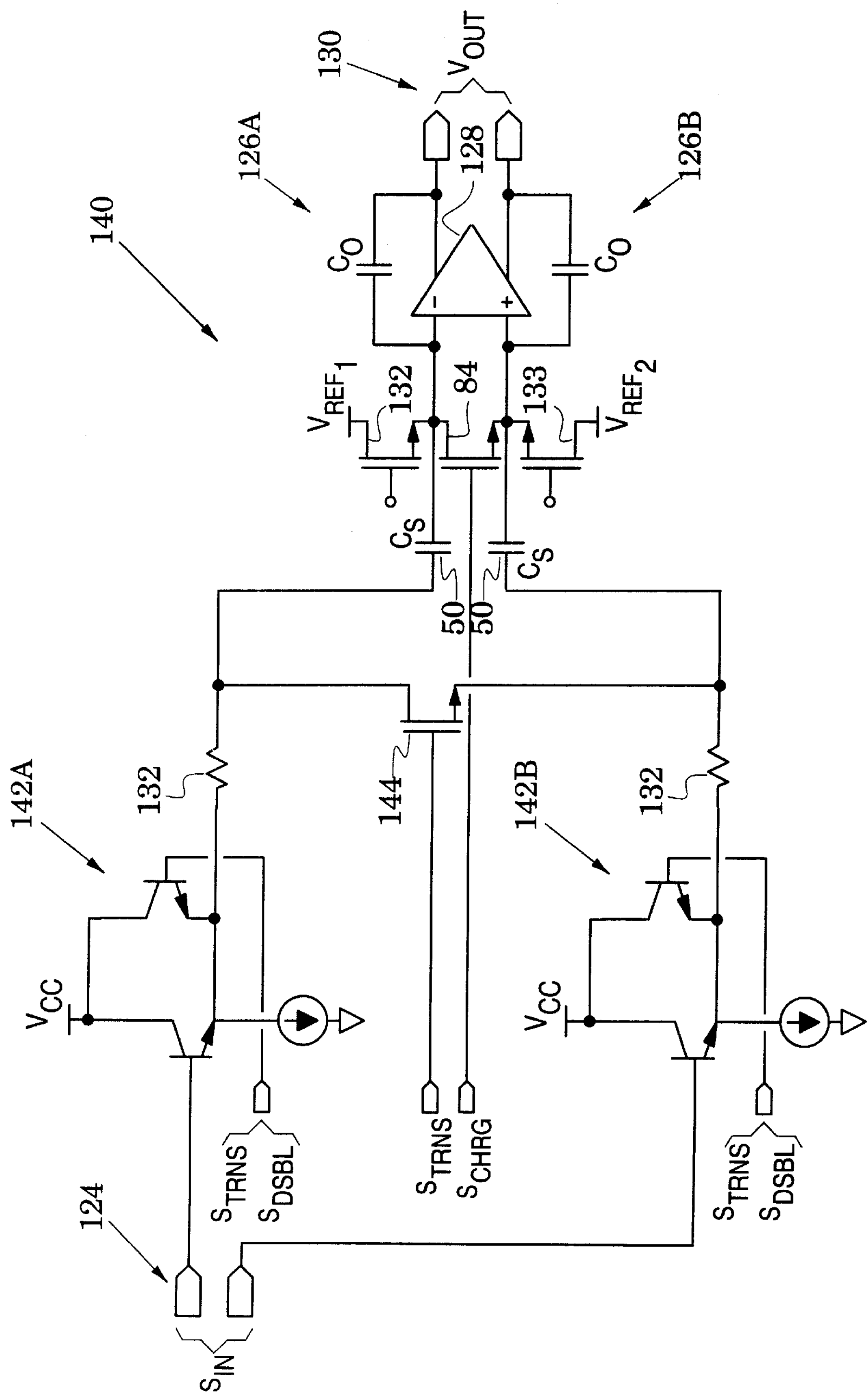
FIG. 4B is a schematic of a differential BiCMOS embodiment of the sampler of FIG. 2.

FIG. 4B illustrates a differential BiCMOS embodiment 140 of the sampler 100 of FIG. 3B. The first and second output assemblies 126A and 126B, the differential amplifier 128, the differential output port 130, resistors 132, the charging transistor 84 and the bias transistors 132 and 133 of the sampler 100 are repeated in the sampler 100.

The first and second input buffer assemblies 122A and 122B of the sampler 100 are, however, replaced with first and second input buffer assemblies 142A and 142B that are arranged to form the differential input port 124. Each of these latter assemblies include the current source 70, the common emitter input buffer transistor 102 and the charge-transfer transistor 106 of FIG. 3B.

To insure that the same common-mode signal $S_{cm}$ is established on the bottom plates of the sampling capacitors 50 during the holding time periods, a shorting transistor 144 is preferably arranged across the bottom plates to short them together in response to the transfer signal $S_{trns}$. Operation of the sampler 140 is functionally equivalent to that of the sampler 100 of FIG. 4A except that a differential input signal $S_{in}$ is differentially processed to realize a differential output voltage $V_{out}$ at the differential output port 130.

Figure 5:
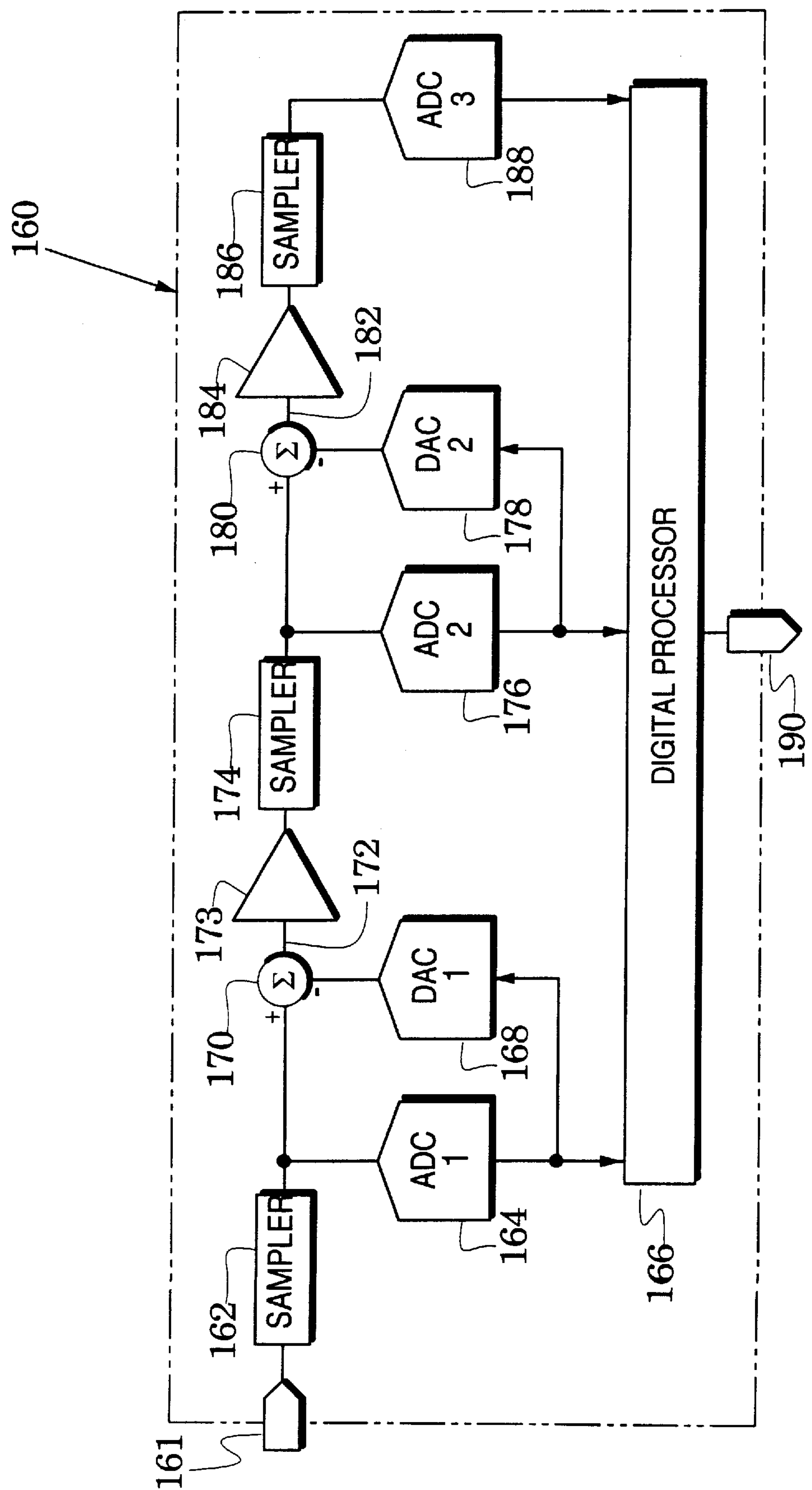
FIG. 5 is a block diagram of a subranging analog-to-digital converter (ADC) that includes a sampler of the present invention.

Simulations of the samplers of the invention have indicated significant performance improvements at high sampling rates (e.g:, >100 megasamples/second) and with large sampling capacitors (e.g., >500 femtofarads). Samplers of the invention are therefore especially suited for use in ADCs. For example, FIG. 5 illustrates an exemplary subranging ADC 160 that receives analog input signals $S_{in}$ at an input port 161 and converts them to digital signals at an output port 190 with the aid of samplers 162, 174 and 186. Sampler 162, for example, can be advantageously realized with the methods and structures of the present invention.

From the sampler 162, samples of the input signal $S_{in}$ at the input port 161 are converted in an initial ADC 164 to an initial set of digital bits which are delivered to a digital processor 166. An initial digital-to-analog converter (DAC) 168 converts the initial set of digital bits to a converted analog signal which is subtracted from the sampled input signal in a differencer 170 to form an initial residue signal 172. Because this action results in an amplitude reduction, the initial residue signal is preferably "gained up" in an amplifier 173 and then sampled in the subsequent sampler 174.

The initial conversion process is then repeated. That is, the sampled residue signal is converted in a subsequent ADC 176 to a subsequent set of digital bits which are delivered to the digital processor 166. A subsequent DAC 178 then converts the subsequent set of digital bits to a converted analog signal which is subtracted from the sampled residue signal in a differencer 180 to form a subsequent residue signal 182.

The subsequent residue signal passes through another amplifier 184 and is sampled in a final sampler 186. A final ADC 188 converts the sampled subsequent residue signal into a final set of digital bits which are combined in the digital processor 166 with the initial and subsequent sets of digital bits to form the final digital output signal at the output port 190.

To facilitate their description, the plates of a sampling capacitor (e.g., plates 63 and 76 in FIG. 2) have been referred to respectively as bottom and top plates. More generally, they may be termed input and output plates or, more simply, first and second plates.

It is noted that the noun "charge" has been used herein as it is conventionally defined, i.e., electrical energy that is stored, for example, in a capacitor and also the quantity of the stored electrical energy. It is further noted that the verb "charging" has been used herein as it is conventionally defined, i.e., as the process of storing electrical energy in a capacitor).

Apparatus of the invention for sampling an input signal $S_{in}$ and holding a corresponding output voltage $V_{out}$ through successive and alternate sampling and holding time periods has been generically referred to herein as samplers (e.g., the sampler 40 of FIG. 3). It is noted, however, that a variety of equivalent terms are generally used (e.g., sample and hold, sample-and-hold amplifier (SHA) and track and hold circuit).

The preferred embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A method of sampling an input signal $S_{in}$ and holding a corresponding output voltage $V_{out}$ through successive and alternate sampling and holding time periods wherein said input signal $S_{in}$ has a common-mode signal $S_{cm}$ component, the method comprising the steps of:

during said sampling time periods, a) enabling an input buffer that receives said input signal $S_{in}$; and b) charging a sampling capacitor $C_s$ through said input buffer to a charge that corresponds to said input signal $S_{in}$;

and during said holding time periods, a) disabling said input buffer to thereby isolate it from said sampling capacitor $C_s$; and b) coupling said sampling capacitor $C_s$ between said common-mode signal $S_{cm}$ and a sampler output port to provide said output voltage $V_{out}$.

2. The method of claim 1, wherein:

said enabling step includes the step of steering a supply current to said input buffer; and said disabling step includes the step of steering said supply current away from said input buffer.

3. The method of claim 1, wherein said coupling step includes the step of transferring electrical charge from said sampling capacitor $C_s$ to an output capacitor $C_o$.

4. The method of claim 3, wherein said transferring step includes the steps of:

connecting said output capacitor $C_o$ between an inverting input port and an output port of a differential amplifier; and connecting said sampling capacitor $C_s$ between said common-mode signal $S_{cm}$ and said inverting input port.

5. The method of claim 3, further including the step of discharging said output capacitor $C_o$ during said sampling time periods.

6. A sampler for sampling an input signal $S_{in}$ and holding a corresponding output voltage $V_{out}$ through successive and alternate sampling and holding time periods wherein said input signal $S_{in}$ has a common-mode signal $S_{cm}$ component, the sampler comprising:

an input buffer that is disabled during said holding periods and that is enabled during said sampling periods to provide a version of said input signal $S_{in}$ to a buffer output port of said input buffer;

a sampling capacitor $C_s$ having a first plate that is coupled to said buffer output port and a second plate that is coupled to a sampler output port;

a charging switch $S_c$ which enables current flow through said sampling capacitor $C_s$ during said sampling time periods; and a charge-transfer switch $S_{c\text{-}t}$ which is open during said sampling time periods and which couples said first plate to said common-mode signal $S_{cm}$ during said holding time periods;

said sampling capacitor $C_s$ thereby charged during said sampling time periods to an electrical charge that corresponds to said input signal $S_{in}$ with said second plate providing said output voltage $V_{out}$ to said sampler output port during said holding time periods.

7. The sampler of claim 6, further including:

a differential amplifier having an inverting input port coupled to said second plate, a noninverting input port and an amplifier output port that forms said sampler output port; and an output capacitor $C_o$ that is connected between said inverting input port and said amplifier output port.

8. The sampler of claim 6, further including a current-source circuit that provides a supply current to said input buffer to enable said input buffer during said sampling time periods and removes said supply current from said input buffer to disable said input buffer during said holding time periods.

9. The sampler of claim 8, wherein said current-source circuit includes:

a current source which generates said supply current; and a current switch which couples said supply current to said input buffer during said sampling time periods and removes said supply current from said input buffer during said holding time periods.

10. The sampler of claim 8, wherein said current-source circuit includes:

a current source which generates said supply current; and a differential pair of first and second transistors coupled to steer said supply current to said input buffer during said sampling time periods and steer said supply current away from said input buffer during said holding time periods.

11. The sampler of claim 10, wherein said charging switch $S_c$, said charge-transfer switch $S_{c-t}$ and said first and second transistors are metal-oxide semiconductor transistors.

12. The sampler of claim 8, wherein said current-source circuit includes a current source that provides said supply current to said input buffer during said sampling time periods and wherein said charge-transfer switch $S_{c-t}$ is arranged to steer said supply current away from said input buffer during said holding time periods.

13. The sampler of claim 6, wherein said input buffer is a metal-oxide semiconductor transistor whose gate is coupled to receive said input signal $S_{in}$ and whose source forms said buffer output port.

14. The sampler of claim 6, wherein said input buffer is a first bipolar junction transistor whose base is coupled to receive said input signal $S_{in}$ and whose emitter forms said buffer output port and said charge-transfer switch $S_{c-t}$ is a second bipolar junction semiconductor transistor that is coupled to form a differential pair with said first bipolar junction semiconductor transistor.

15. The sampler of claim 6, further including a discharge switch $S_d$ arranged to discharge said output capacitor $C_o$ during said sampling time periods.

16. An ananalog-to-digital converter system that converts an input signal $S_{in}$ having a common-mode signal $S_{cm}$ component to a corresponding digital output signal, comprising:

a sampler that is arranged to sample said input signal $S_{in}$ and hold a corresponding output voltage $V_{out}$ through successive and alternate sampling and holding time periods, said sampler including:

a) an input buffer that is disabled during said holding periods and that is enabled during said sampling periods to provide a version of said input signal $S_{in}$ to a buffer output port of said input buffer;

b) a sampling capacitor $C_s$ having a first plate that is coupled to said buffer output port and a second plate that is coupled to a sampler output port;

c) a charging switch $S_c$ which enables current flow through said sampling capacitor $C_s$ during said sampling time periods; and d) a charge-transfer switch $S_{c-t}$ which is open during said sampling time periods and which couples said first plate to said common-mode signal $S_{cm}$ during said holding time periods to provide said output voltage $V_{out}$ at said second plate; and a analog-to-digital converter that converts said output voltage $V_{out}$ to a respective set of digital bits of said digital output signal.

17. The system of claim 16, wherein said sampler further includes a current-source circuit that provides a supply current to said input buffer to enable said input buffer during said sampling time periods and removes said supply current from said input buffer to disable said input buffer during said holding time periods.

18. The system of claim 16, wherein said sampler further includes:

a differential amplifier having an inverting input port coupled to said second plate, a noninverting input port and an amplifier output port that forms said system output port; and an output capacitor $C_o$ that is connected between said inverting input port and said amplifier output port.

19. The system of claim 17, wherein said sampler further includes a discharge switch $S_d$ arranged to discharge said output capacitor $C_o$ during said sampling time periods.

20. The system of claim 16, wherein said analog-to-digital converter includes:

an initial analog-to-digital converter that converts said output voltage $V_{out}$ to an initial set of digital bits of said digital output signal;

a digital-to-analog converter that converts said initial set of digital bits to an analog signal that is subtracted from said input signal $S_{in}$ to form an analog residue signal; and an final analog-to-digital converter that converts said analog residue signal to a final set of digital bits of said digital output signal.

* * * * *